(12) United States Patent
Lee

(10) Patent No.: US 6,482,721 B1
(45) Date of Patent: *Nov. 19, 2002

(54) METHOD OF MANUFACTURING A POLYSILICON ACTIVE LAYER IN A THIN FILM TRANSISTOR

(75) Inventor: Kyung Eon Lee, Suwon (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/518,980

(22) Filed: Mar. 3, 2000

(30) Foreign Application Priority Data

Apr. 3, 1999 (KR) ............................................. 99-11740

(51) Int. Cl.[7] .............................................. H01L 21/20
(52) U.S. Cl. ...................... 438/486; 438/151; 438/155; 438/160
(58) Field of Search ................. 438/151, 152, 438/155, 159, 160, 161, 166, 149, 486

(56) References Cited

U.S. PATENT DOCUMENTS

| 5,061,648 A | * 10/1991 | Aoki et al. ................. 437/41 |
| 5,210,045 A | * 5/1993 | Possin et al. ................. 437/42 |
| 5,569,936 A | * 10/1996 | Zhang et al. ................. 257/66 |
| 5,677,549 A | * 10/1997 | Takayama et al. ............. 257/66 |
| 5,888,857 A | * 3/1999 | Zhang et al. ................. 438/162 |
| 6,169,292 B1 | * 1/2001 | Yamazaki et al. ............. 257/72 |
| 6,326,226 B1 | * 12/2001 | Jang et al. ..................... 438/48 |

FOREIGN PATENT DOCUMENTS

| GB | 2311299 A | * 9/1997 | ......... H01L/29/786 |
| JP | 03286739 | * 5/1993 | ......... H01L/29/784 |

* cited by examiner

Primary Examiner—Matthew Smith
Assistant Examiner—Renzo N. Rocchegiani
(74) Attorney, Agent, or Firm—Birch, Stewart, Kolasch & Birch, LLP

(57) ABSTRACT

A method for manufacturing a polysilicon layer includes providing a substrate, forming an amorphous silicon layer on an entire surface of the substrate, defining an active area on the amorphous silicon layer, doping the amorphous silicon layer with a semiconductor material, depositing a metal layer on the amorphous silicon layer; and applying a voltage to the amorphous silicon layer to form a polysilicon layer using a joule heat that is generated from the applied voltage.

34 Claims, 6 Drawing Sheets

METHOD OF MANUFACTURING A POLYSILICON ACTIVE LAYER IN A THIN FILM TRANSISTOR

This application claims the benefit of Korean Patent Application No. 1999-11740, filed on Apr. 3, 1999, which is hereby incorporated by reference.

BACKGROUND OF THE INVENTION

1. Field of the Invention

The present invention relates to a method for manufacturing polysilicon rapidly from amorphous silicon and more specifically, the present invention relates to a method for forming crystallized polysilicon channels in thin film transistors.

2. Discussion of the Related Arts

Thin film transistors (TFTs) are vital for high performance liquid crystal displays (LCDs), which are one of the most important components of a laptop computer. TFTs are also applied in other two-dimensional (2D) displays, sensors, and electronics. Currently, most large arrays of TFTs are formed on amorphous materials, such as a hydrogen amorphous silicon (a-Si:H). However, a-Si:H based TFTs have drawbacks such as low mobility and high photosensitivity. Therefore, extra process steps are required in the manufacturing process to compensate for these problems. For example, a black matrix is used to block light from reaching the TFTs, and the drivers for the display have to be manufactured in a separate process from the TFTs of the array.

To avoid the problems related to displays with a-Si:H based TFTs, polysilicon TFTs are preferred. However, one significant drawback to a polysilicon TFT is high leakage current. But, proper design of a polysilicon TFT structure can minimize the leakage current, and the display panel manufacturing process is simplified and cost is reduced when the drive circuits are integrated into the pixel TFT manufacturing process. However, a major problem with manufacturing polysilicon TFTs is the formation of polysilicon under certain required conditions, which include: (1) a low process temperature, for example, less than 550° C. on a low temperature glass; (2) a large glass substrate; and (3) a high throughput.

Therefore, high temperature processes, such as annealing, which are conducted at temperatures of about 700° C., are not suitable for the low temperature glass that is required for manufacturing polysilicon TFTs. Several other methods, including laser crystallization, furnace annealing, and reactive chemical vapor deposition have been used for preparing the polysilicon. But these methods also require either high temperatures or lengthy process times. Also, uniformity over a large area is difficult to achieve. Therefore, with conventional methods, high quality polysilicon cannot be made efficiently.

FIG. 1 shows another conventional method for making polysilicon called Metal Induced Lateral Crystallization (MILC), which is included in the furnace annealing method. Referring to FIG. 1, after an amorphous silicon layer 21 is provided on a glass substrate 20, an insulating material is deposited on the amorphous silicon layer 21 and then patterned to define a protection film 23. On the amorphous silicon layer 21 is provided a metal layer 25 made of a material such as Ni or Pd. Next, the substrate 20 and the metal layer 25 are heated in an electric furnace for over ten hours at about 550° C. A portion of the amorphous silicon layer 21 that is beneath the protection film 23, where the metal has not been deposited, is crystallized from the outer portions towards the inner portions and constitutes a polysilicon layer 22.

As mentioned earlier, the conventional methods require either a high temperature process or a lengthy process. Therefore, as in the other conventional methods, the throughput with the MILC process is low, and high quality polysilicon can not be formed.

SUMMARY OF THE INVENTION

To overcome the problems described above, preferred embodiments of the present invention provide a method of manufacturing polysilicon crystals in a TFT such that polysilicon is formed on a large glass substrate rapidly and at low temperatures with the resultant polysilicon TFTs having a high throughput rate.

A preferred embodiment of the present invention provides a method for manufacturing a polysilicon layer including the steps of providing a substrate, forming an amorphous silicon layer on an entire surface of the substrate, and patterning the amorphous silicon layer, forming an active area on the amorphous silicon layer; and applying a voltage to the amorphous silicon layer to form a polysilicon layer using a joule heat that is generated from the applied voltage.

In another preferred embodiment of the present invention, a method for manufacturing a polysilicon layer in a thin film transistor includes providing a substrate, forming an amorphous silicon layer on the entire surface of the substrate, forming an active area on the amorphous silicon layer, doping the amorphous semiconductor layer with a semiconductor material, and depositing a metal layer on the amorphous silicon layer; and applying a voltage to the amorphous silicon layer, and converting the amorphous silicon layer into a polysilicon layer using a joule heat generated from the applied voltage.

In preferred embodiments, the joule heat that is generated by the voltage applied to the amorphous silicon layer crystallizes the undoped portion of the amorphous silicon layer. During the crystallization process, the temperature of the amorphous silicon layer is increased only to about 500° C., which is much lower than the conventional methods.

Further, in preferred embodiments, there are three preferred methods to form the active area of the TFT. In a first preferred method, the active area is defined by forming a protection layer on a predetermined portion of the amorphous silicon layer, doping the amorphous silicon layer with a semiconductor material, and then depositing a metal layer over the substrate and covering the protection layer and the doped amorphous silicon layer. A second preferred method includes providing a photoresist protection layer on the amorphous silicon layer and etching the photoresist protection layer, doping the amorphous silicon layer with a semiconductor material, and depositing a metal layer on the amorphous silicon layer to cover the photoresist protection layer, and patterning the photoresist protection layer and the metal layer to expose a portion of the amorphous silicon layer that is beneath the photoresist protection layer. Finally, a third preferred method includes doping the amorphous silicon layer with a semiconductor material, depositing a metal layer on the amorphous silicon layer, and patterning the doped amorphous silicon layer and the metal layer such that the amorphous silicon layer is over-etched so that a doped portion of the amorphous silicon layer is removed thereby exposing substantially an undoped portion of the amorphous silicon layer.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given hereinbelow and the accompanying drawings which are given by way of illustration only, and thus do not limit the present invention and wherein.

DETAILED DESCRIPTION OF PREFERRED EMBODIMENTS

Figure 1:
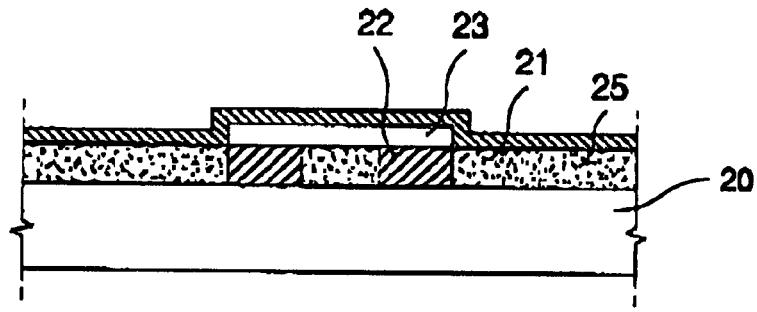
FIG. 1 illustrates a conventional method for making polysilicon which is referred to as Metal Induced Lateral Crystallization.
Figure 2:
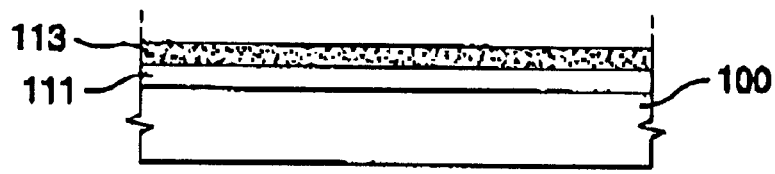
FIG. 2 is a cross-sectional view for illustrating the beginning step in the process for making a polysilicon layer according to preferred embodiments of the present invention.

FIG. 2 shows the beginning step in the process for manufacturing a polysilicon layer for an active layer of a TFT according to a preferred embodiment of the present invention. Referring to FIG. 2, an insulating material such as $SiO_2$ is deposited on an entire surface of the glass substrate 100 to provide a buffer layer 111. The buffer layer 111 is used to prevent misalignment between the glass-substrate 100 and a semiconductor layer that is to be provided later, and also to prevent the semiconductor layer from being contaminated. On the buffer layer 111, there is deposited an amorphous silicon material to provide an amorphous silicon layer 113. At this point, a pattern can be selected from several patterns for defining the active area of the thin film transistor. One of the factors to be considered in selecting a pattern includes the current-flow when a voltage is applied.

Figure 3:
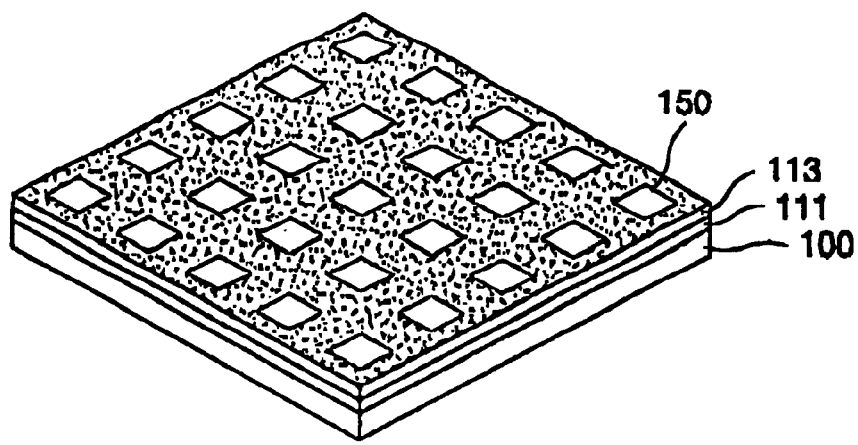
FIG. 3 is a plan view illustrating a first sample pattern for the active area of a thin film transistor according to a preferred embodiment of the present invention.
Figure 4:
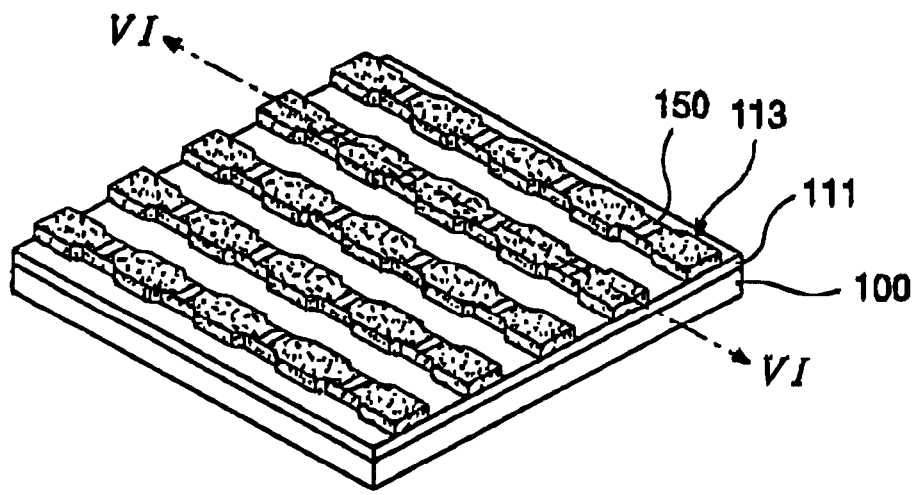
FIG. 4 is a plan view illustrating a second sample pattern for the active area of the thin film transistor according to a preferred embodiment of the present invention.
Figure 5:
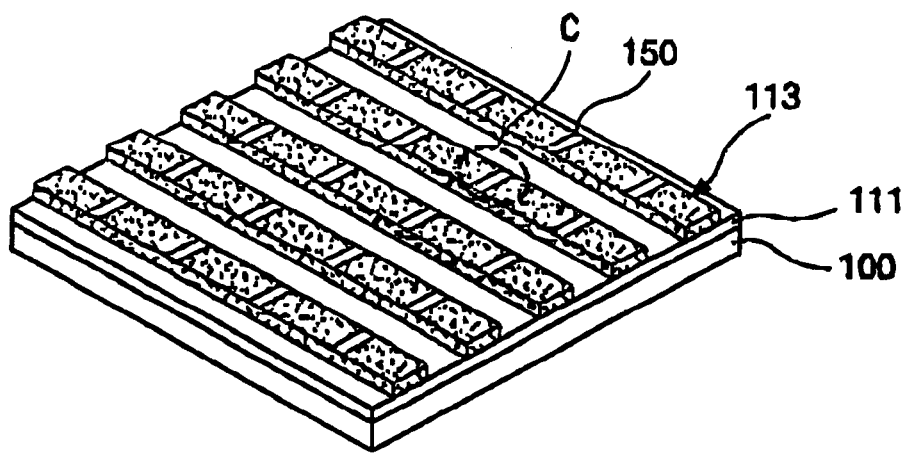
FIG. 5 is a plan view illustrating a third sample pattern for the active area of the thin film transistor according to another preferred embodiment of the present invention.

FIGS. 3 to 5 show various patterns for defining the active area of the TFT. FIG. 3 shows a first sample pattern. In the first sample pattern, the amorphous silicon is deposited on the entire surface of the glass substrate 100, and the active areas 150 of the TFTs are provided in the form of a matrix. FIG. 4 shows a second sample pattern, which is a modification of the first pattern. The amorphous silicon material is deposited and then patterned in the shape of laterally extended amorphous silicon layers 113 preferably having a substantially octagonal shape and having an active area 150 with a substantially rectangular shape. The second pattern has the advantage of having a low caloric value for the entire silicon layer 113.

For a more detailed explanation, the expression for the caloric value "H" is given below:

$$H = P \times t = \frac{V^2}{R} \times t$$

where "V" is a voltage, "R" is a resistance, and "t" is a time period. More specifically, since the area where a voltage is applied (i.e., the patterned amorphous silicon layer 113) to the substrate 100 is decreased, the resistance of the amorphous silicon layer 113 is increased. Thus, according to the above equation, the caloric value of the silicon layer 113 is decreased, which helps to maintain the glass substrate 100 at a low temperature during the crystallization process.

FIG. 5 shows a third sample pattern, which is a modification of the second pattern. An active area 150 and an amorphous silicon layer 113 are preferably formed in the same way as the second pattern. The width of the active area 150 is preferably substantially the same as the amorphous silicon layer 113. As in the second sample pattern, the caloric value of the entire silicon layer 113 is reduced since the area of the silicon layer is reduced.

After defining the active area 150, a method for manufacturing the active area 150 according to preferred embodiments is as follows. There are three preferred methods for manufacturing the active area of the TFT in the present invention.

Figure 6A:
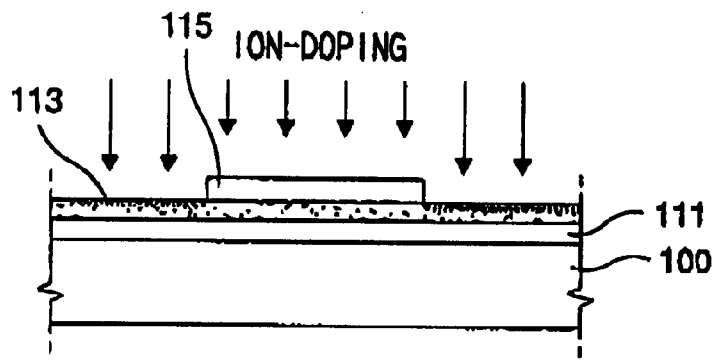
FIGS. 6A to 6C are sectional views taken along the line VI—VI of FIG. 4, and which shows a first preferred method for manufacturing the active area of the thin film transistor.
Figure 6B:
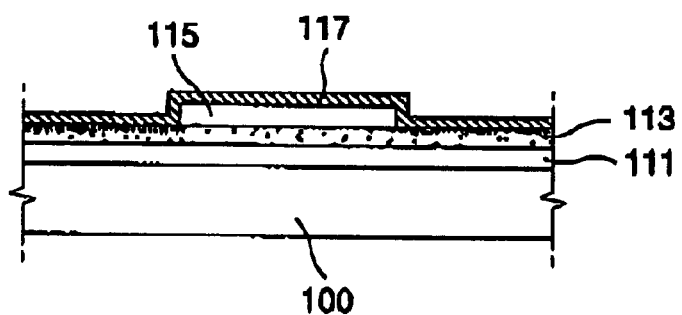
Figure 6C:
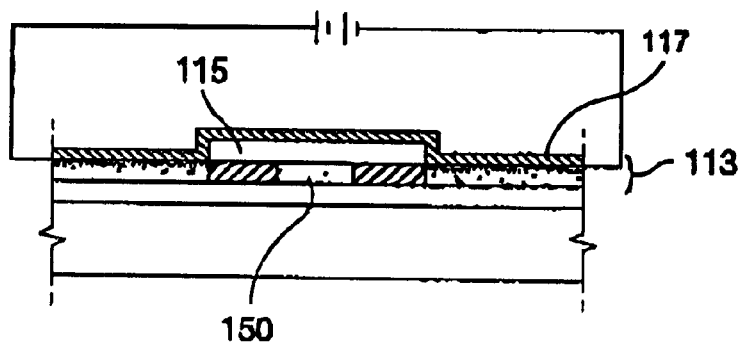

FIGS. 6A to 6C illustrate a first preferred method for manufacturing the active area of the TFT. Though FIGS. 6A to 6C are sectional views of FIG. 4, the sample patterns for the silicon layer as shown in FIGS. 3 and 5 can also be used in the following method. Referring to FIG. 6A, after patterning the amorphous silicon layer 113, an insulating substance is then deposited on the amorphous silicon layer 113 and then patterns to define a protection layer 115. Next, N-type or P-type semiconductor material dopes the amorphous silicon layer 113. This process creates a surface with a low resistance on the amorphous silicon layer 113.

Referring to FIG. 6B, a metal layer 117 is deposited over the entire surface of the substrate 100 and covers the protection layer 115 and the doped silicon layer 113. The metal layer 117 preferably uses a metal such as Ni or Pd for defining a silicide layer that is created by the reaction of the metal layer 117 with the silicon layer 113. Note that when the reaction creates the silicide layer, the resistance of the silicon layer 113 is decreased. Thus, the silicide layer is used as a heating element for a joules heat. Note that the amorphous silicon is a semiconductor material so that the resistivity of the amorphous silicon layer becomes lower as the temperature of the amorphous silicon becomes higher. Lower resistivity can also be achieved when the amorphous silicon layer is doped by the N-type or P-type semiconductor material. Therefore, the amorphous silicon layer can be used as the heating element for supplying the joules heat when a voltage is applied such that the resistivity of the amorphous silicon layer is lowered to a predetermined level.

Referring to FIG. 6C, a voltage for the crystallization process is applied at both terminals of the substrate 100. As described previously, because of the doping process and the silicide layer, the caloric value in the active area 150 is higher because of its lower resistance. Note that the crystallization of the polysilicon 160 proceeds from the interface between the metal layer 117 and the ion-doped amorphous silicon layer 113 towards the inside of the amorphous silicon layer 113.

Figure 7A:
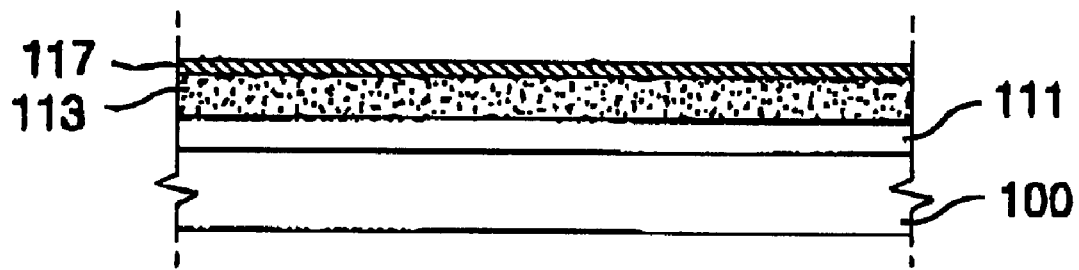
FIGS. 7A to 7B illustrates a second preferred method for manufacturing the active area of the thin film transistor.
Figure 7B:
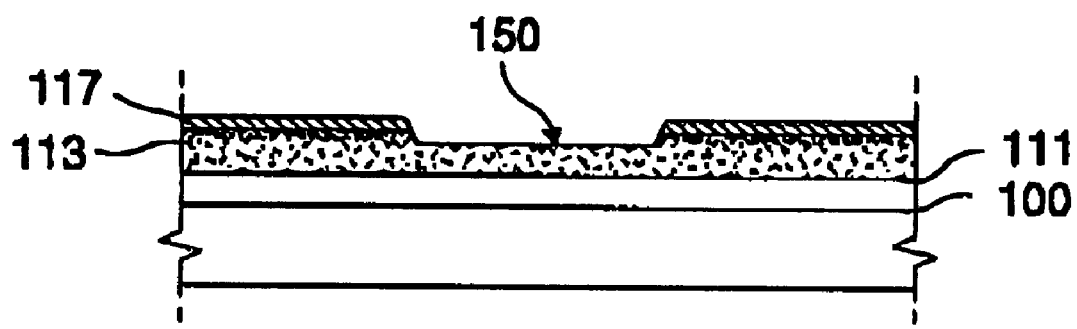

FIGS. 7A to 7B show a second preferred method for manufacturing an active area for a TFT. Referring to FIG. 7A, after patterning the amorphous silicon layer 113, N-type or P-type semiconductor material dopes the amorphous silicon layer 113. Thereafter, a metal layer 117 is deposited on an entire surface of the amorphous silicon layer 113.

Referring to FIG. 7B, the doped amorphous silicon layer 113 and the metal layer 117 is patterned to form an active area 150. Note that at this point, the active region 150 of the amorphous silicon layer 113 is over-etched so that the doped portion may be removed. This is done to prevent the TFT from having low switching characteristics.

Figure 8A:
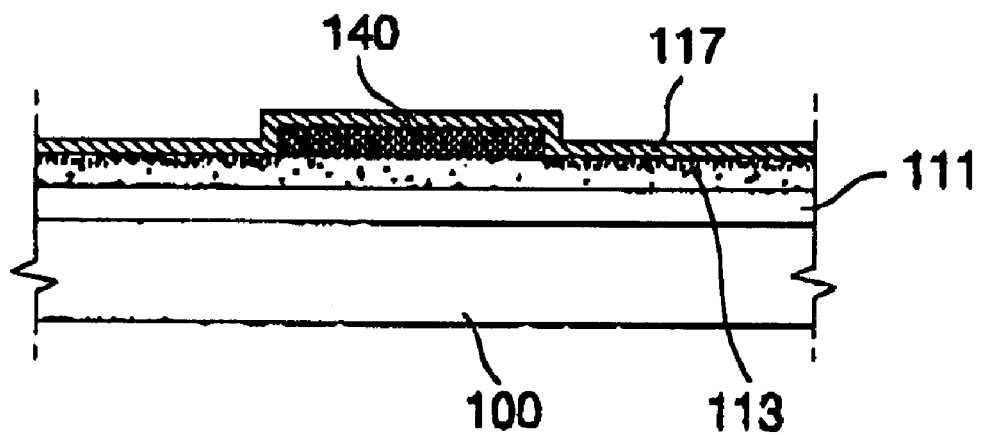
FIGS. 8A to 8B illustrates a third preferred method for manufacturing the active area of the thin film transistor.
Figure 8B:
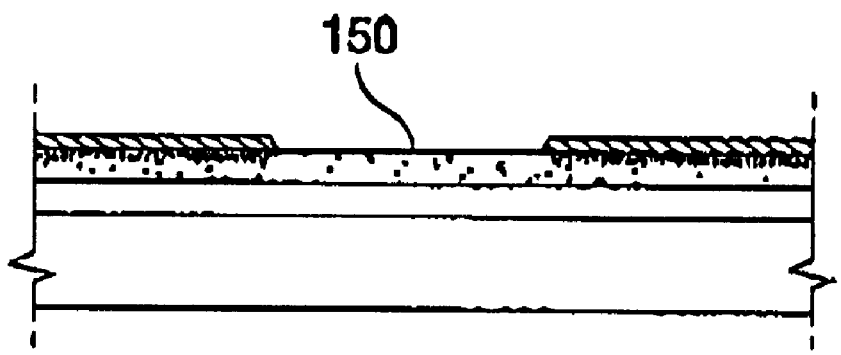

A third preferred method for manufacturing the active area of a TFT is shown in FIGS. 8A to 8B. Referring to FIG. 8A, after patterning the amorphous silicon layer 113, a photoresist is deposited on the amorphous silicon layer 113 and then patterned to provide a photoresist protection layer 140. Then, N-type or P-type semiconductor material dopes the amorphous silicon layer 113, and a metal layer 117 is then deposited on the amorphous silicon layer 113 and covers the photoresist protection layer 140.

Referring to FIG. 8B, the photoresist protection layer 140 and the metal layer 117 is etched so that a predetermined portion of the amorphous silicon layer 113, the portion which is directly beneath the photoresist layer 140, is exposed to define the active area 150. Note that in the present preferred method, there is no need for the amorphous silicon layer 113 to be over-etched as in the method of FIG. 7B since the active area 150 is not doped due to the protection layer 140.

Figure 9:
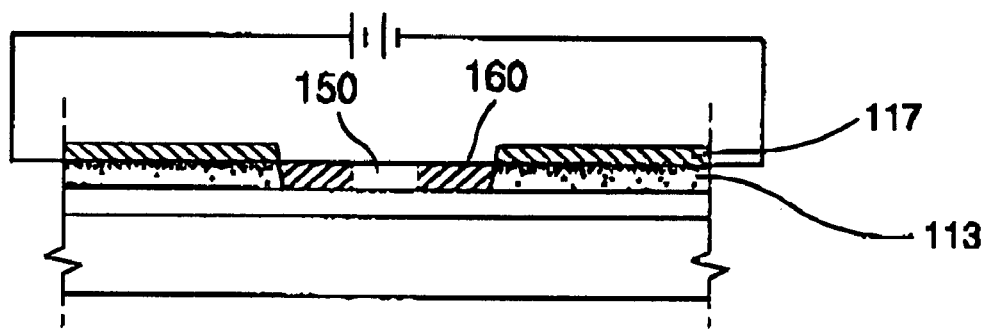
FIG. 9 is a plan view illustrating a method of crystallizing polysilicon according to another preferred embodiment of the present invention.

In the second and third preferred methods, the next step in the manufacturing process is to apply a voltage for crystallization of the polysilicon. Referring to FIG. 9, when a voltage is applied to both terminals of the substrate 100, polysilicon crystals 160 are grown at the exposed portion 150 of the amorphous silicon layer 113. The polysilicon crystals 160 grow towards the inside of the amorphous silicon layer 113 from the interface between the metal layer 117 and the doped amorphous silicon layer 113.

Figure 10:
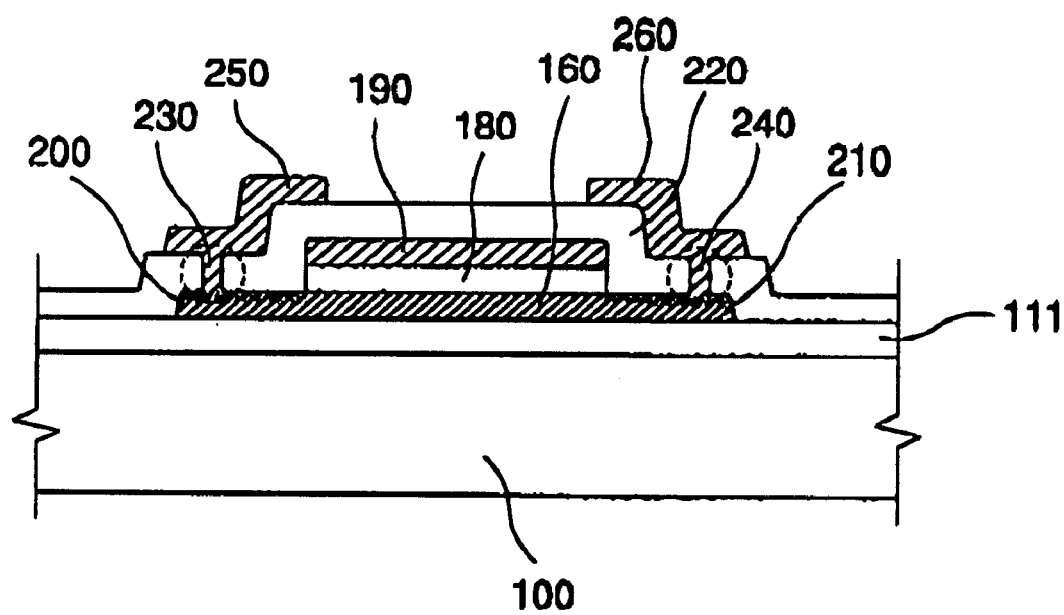
FIG. 10 illustrates a manufacturing process for a thin film transistor according to another preferred embodiment of the present invention.

Referring to FIG. 10, the amorphous silicon layer 113 is then etched, and only the polysilicon layer 160 remains. Next, an insulating material and a metal conductive material are sequentially deposited on the polysilicon layer 160 and then patterned simultaneously to provide a first insulating layer 180 and a gate electrode 190, respectively, and which are patterned such that the end portions of the polysilicon layer 170 are exposed. Then, N-type or P-type semiconductor material dopes the exposed end portions of the polysilicon layer 160 for defining source and drain regions 200 and 210. Then, an insulating material is deposited on the entire surface of the substrate 100 to provide a second insulating layer 220 and covers the gate electrode 190. First and second contact holes 230 and 240 are provided on the second insulating layer 220 for exposing the source and drain regions 200 and 210. Source and drain electrodes 250 and 260 are then defined to electrically connect the source and drain regions 200 and 210.

Therefore, preferred embodiments of the present invention provide a method for manufacturing polysilicon TFTs such that a polysilicon layer is provided at relatively low temperatures, for example, less than about 550° C., and maintaining the glass substrate at a low temperature for about five hours so that a throughput is high.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for manufacturing a polysilicon layer, comprising the steps of:
   providing a substrate;
   forming an amorphous silicon layer on an entire surface of the substrate, and patterning the amorphous silicon layer;
   forming an active area on the amorphous silicon layer; and
   applying a voltage to the amorphous silicon layer to form a polysilicon layer using only a joule heat that is generated from the applied voltage, and a caloric value H of the joule heat is given by the expression:

$$H = P \times t = \frac{V^2}{R} \times t$$

where V is voltage, R is resistance and t is a time period.

2. The method according to claim 1, wherein the step of forming the active area includes forming the active area substantially in the form of a matrix.

3. The method according to claim 1, wherein the step of forming the active area further comprises the steps of:
   providing a protection layer on the amorphous silicon layer;
   doping the amorphous silicon layer with a semiconductor material; and
   depositing a metal layer over the substrate and covering the protection layer and the doped amorphous silicon layer.

4. The method according to claim 3, wherein the step of providing the protection layer includes depositing an insulating substance on the amorphous silicon layer and patterning the insulating substance.

5. The method according to claim 3, wherein the step of applying the voltage further comprises growing polysilicon crystals inwardly from an interface between the metal layer and the doped amorphous silicon layer.

6. The method according to claim 1, wherein the step of forming the active area further comprises the steps of:
   providing a photoresist protection layer on the amorphous silicon layer and etching the photoresist protection layer;
   doping the amorphous silicon layer with a semiconductor material; and
   depositing a metal layer on the amorphous silicon layer to cover the photoresist protection layer; and
   patterning the photoresist protection layer and the metal layer to expose a portion of the amorphous silicon layer that is beneath the photoresist protection layer.

7. The method according to claim 6, wherein the step of applying the voltage further comprises growing polysilicon crystals inwardly from an interface between the metal layer and the doped amorphous silicon layer such that a polysilicon layer is provided at the exposed portion of the amorphous silicon layer.

8. The method according to claim 7, further comprising etching the amorphous silicon layer so that all of the amorphous silicon layer is removed and so that only the polysilicon layer remains on the substrate.

9. The method according to claim 8, further comprising the steps of:
sequentially depositing an insulating material and a conductive material on the polysilicon layer;
simultaneously patterning the insulating material and the conductive material to provide a first insulating layer and a gate electrode on the polysilicon layer and such that end portions of the polysilicon layer are exposed;
doping the end portions of the polysilicon layer with a semiconductor material for defining a source and drain regions;
forming a second insulating layer on the substrate and covering the gate electrode;
forming contact holes in the second insulating layer for exposing the source and drain regions; and
forming source and drain electrodes in contact with the source and drain regions, respectively, via the contact holes.

10. The method according to claim 1, wherein the step of forming the active area further comprises the steps of:
doping the amorphous silicon layer with a semiconductor material;
depositing a metal layer on the amorphous silicon layer; and
patterning the doped amorphous silicon layer and the metal layer such that the amorphous silicon layer is over-etched so that a doped portion of the amorphous silicon layer is removed thereby exposing substantially an undoped portion of the amorphous silicon layer.

11. The method according to claim 10, wherein the step of applying the voltage further comprises growing polysilicon crystals inwardly from an interface between the metal layer and the doped amorphous silicon layer such that a polysilicon layer is provided at the exposed portion of the amorphous silicon layer.

12. The method according to claim 11, further comprising etching the amorphous silicon layer so that all of the amorphous silicon layer is removed and so that only the polysilicon layer remains on the substrate.

13. The method according to claim 1, wherein the step of forming the active area includes shaping a width of the active area to be substantially smaller than a width that of the amorphous silicon layer.

14. The method according to claim 1, wherein the step of forming the active area includes shaping a width of the active area to be substantially equal to a width of the amorphous silicon layer.

15. The method according to claim 1, wherein the step of applying the voltage includes increasing a temperature of the active area to about 500° C.

16. The method according to claim 1, wherein the amorphous silicon layer is used as a heating element for supplying the joule heat when the voltage is applied, such that a resistivity of the amorphous silicon layer is lowered.

17. The method according to claim 1, wherein the caloric value of the silicon layer is decreased.

18. A method for manufacturing a polysilicon layer of a thin film transistor, comprising steps of:
providing a substrate;
forming an amorphous silicon layer on an entire surface of the substrate;
forming an active area on the amorphous silicon layer;
doping the amorphous semiconductor layer with a semiconductor material, and depositing a metal layer on the amorphous silicon layer; and
applying a voltage to the amorphous silicon layer, and converting the amorphous silicon layer into a polysilicon layer using only a joule heat generated from the applied voltage, and a caloric value H of the joule heat is given by the expression:

$$H = P \times t = \frac{V^2}{R} \times t$$

where V is voltage, R is resistance and t is a time period.

19. The method according to claim 18, wherein the step of forming the active area includes forming the active area substantially in the form of a matrix.

20. The method according to claim 18, wherein the step of forming the active area further comprises forming a protection layer on the amorphous silicon layer.

21. The method according to claim 20, wherein the step of forming the protection layer includes depositing an insulating substance on the amorphous silicon layer and patterning the insulating substance.

22. The method according to claim 20, wherein the step of converting the amorphous silicon layer further comprises growing polysilicon crystals inwardly from an interface between the metal layer and the doped amorphous silicon layer.

23. The method according to claim 18, wherein the step of forming the active area further comprises the steps of:
providing a photoresist protection layer on the amorphous silicon layer and etching the photoresist protection layer; and
patterning the photoresist protection layer and the metal layer to expose a portion of the amorphous silicon layer that is beneath the photoresist protection layer.

24. The method according to claim 23, wherein the step of converting the amorphous silicon layer further comprises growing polysilicon crystals inwardly from an interface between the metal layer and the doped amorphous silicon layer such that a polysilicon layer is provided at the exposed portion of the amorphous silicon layer.

25. The method according to claim 24, further comprising etching the amorphous silicon layer so that all of the amorphous silicon layer is removed and so that only the polysilicon layer remains on the substrate.

26. The method according to claim 25, further comprising the steps of:
sequentially depositing an insulating material and a conductive material on the polysilicon layer;
simultaneously patterning the insulating material and the conductive material to provide a first insulating layer and a gate electrode on the polysilicon layer and such that end portions of the polysilicon layer are exposed;
doping the end portions of the polysilicon layer with a semiconductor material for defining a source and drain regions;
providing a second insulating layer on the substrate and covering the gate electrode;
forming contact holes in the second insulating layer for exposing the source and drain regions; and
forming source and drain electrodes in contact with the source and drain regions, respectively, via the contact holes.

27. The method according to claim 18, wherein the step of forming the active area further comprises patterning the doped amorphous silicon layer and the metal layer such that the amorphous silicon layer is over-etched so that a doped portion of the amorphous silicon layer is removed thereby exposing substantially an undoped portion of the amorphous silicon layer.

28. The method according to claim 27, wherein the step converting the amorphous silicon layer further comprises growing polysilicon crystals inwardly from an interface between the metal layer and the doped amorphous silicon layer such that a polysilicon layer is provided at the exposed portion of the amorphous silicon layer.

29. The method according to claim 28, further comprising etching the amorphous silicon layer so that all of the amorphous silicon layer is removed and so that only the polysilicon layer remains on the substrate.

30. The method according to claim 18, wherein the step of forming the active area includes shaping a width of the active area to be substantially smaller than a width that of the amorphous silicon layer.

31. The method according to claim 18, wherein the step of forming the active area includes shaping a width of the active area to be substantially equal to a width of the amorphous silicon layer.

32. The method according to claim 18, wherein the step of applying the voltage includes raising a temperature of the active area to about 500° C.

33. The method according to claim 18, wherein the amorphous silicon layer is used as a heating element for supplying the joule heat when the voltage is applied, such that a resistivity of the amorphous silicon layer is lowered.

34. The method according to claim 18, wherein the caloric value of the silicon layer is decreased.

* * * * *